United States Patent
Laptev

(10) Patent No.: US 7,467,598 B2
(45) Date of Patent: Dec. 23, 2008

(54) SYSTEM FOR, AND METHOD OF, ETCHING A SURFACE ON A WAFER

(75) Inventor: Pavel N. Laptev, Santa Barbara, CA (US)

(73) Assignee: Tegal Corporation, Petaluma, CA (US)

( * ) Notice: Subject to any disclaimer, the term of this patent is extended or adjusted under 35 U.S.C. 154(b) by 1796 days.

(21) Appl. No.: 09/829,587

(22) Filed: Apr. 9, 2001

(65) Prior Publication Data
US 2003/0017709 A1 Jan. 23, 2003

(51) Int. Cl.
| C23C 16/503 | (2006.01) |
| C23C 16/505 | (2006.01) |
| C23C 16/509 | (2006.01) |
| C23F 1/00   | (2006.01) |
| H01L 21/306 | (2006.01) |
| C23C 16/06  | (2006.01) |

(52) U.S. Cl. .............. 118/723 E; 156/723 R; 156/345.43; 156/345.44; 156/345.46; 156/345.47

(58) Field of Classification Search ............... 118/50.1, 118/620, 715, 723 E, 723 ER, 723 MA, 723 ME, 118/723 MP, 723 R; 156/345.12, 345.29, 156/345.42, 345.43, 345.46, 345.47, 345.49, 156/345.51, 345.44; 204/192.12, 192.15, 204/192.17, 192.23, 192.25, 192.26
See application file for complete search history.

(56) References Cited

U.S. PATENT DOCUMENTS

| 5,810,933 A * | 9/1998 | Mountsier et al. ........... 118/724 |
| 5,897,752 A * | 4/1999 | Hong et al. ............ 204/192.15 |
| 5,942,042 A * | 8/1999 | Gogh ......................... 118/500 |
| 5,980,687 A * | 11/1999 | Koshimizu ................ 118/715 |
| 6,033,482 A * | 3/2000 | Parkhe ........................ 279/128 |
| 6,146,464 A * | 11/2000 | Beinglass et al. ........... 118/730 |
| 6,220,201 B1 * | 4/2001 | Nowak et al. ......... 118/723 AN |
| 6,237,527 B1 * | 5/2001 | Kellerman et al. ...... 118/723 R |
| 6,346,428 B1 * | 2/2002 | Athavale et al. ............. 361/234 |
| 6,379,576 B2 * | 4/2002 | Luo et al. ................ 118/723 E |
| 6,406,925 B1 * | 6/2002 | Athavale et al. ............ 427/573 |

* cited by examiner

*Primary Examiner*—Rudy Zervigon
(74) *Attorney, Agent, or Firm*—Fliesler Meyer LLP

(57) ABSTRACT

First and second electrodes at opposite ends and magnets between the electrodes define an enclosure. Inert gas (e.g. argon) molecules pass into the enclosure through an opening near the first electrode and from the enclosure through an opening near the second electrode. A ring near the first electrode, a plate near the second electrode and the magnets are at a reference potential (e.g. ground). The first electrode is biased at a high voltage by a high alternating voltage to produce a high intensity negative electrical field. The second electrode is biased at a low negative voltage by a low alternating voltage to produce a low intensity negative electrical field. Electrons movable in a helical path in the enclosure near the first electrode ionize inert gas molecules. A wafer having a floating potential and an insulating layer is closely spaced from the second electrode. The electrode and the wafer define plates of a first capacitor having a dielectric formed by inert gas molecules and ions between the plates to provide a high impedance. The wafer and the inert gas ions in the enclosure define opposite plates of a second capacitor, in series with the first capacitor, having the insulating layer as the dielectric to define a low impedance. The first capacitor accordingly controls and limits the speed at which the gas ions move to the insulating layer surface to etch this surface. The resultant etch, only a relatively few Ångstroms, of the insulating layer is smooth, uniform and accurate even in sockets as for vias.

30 Claims, 2 Drawing Sheets

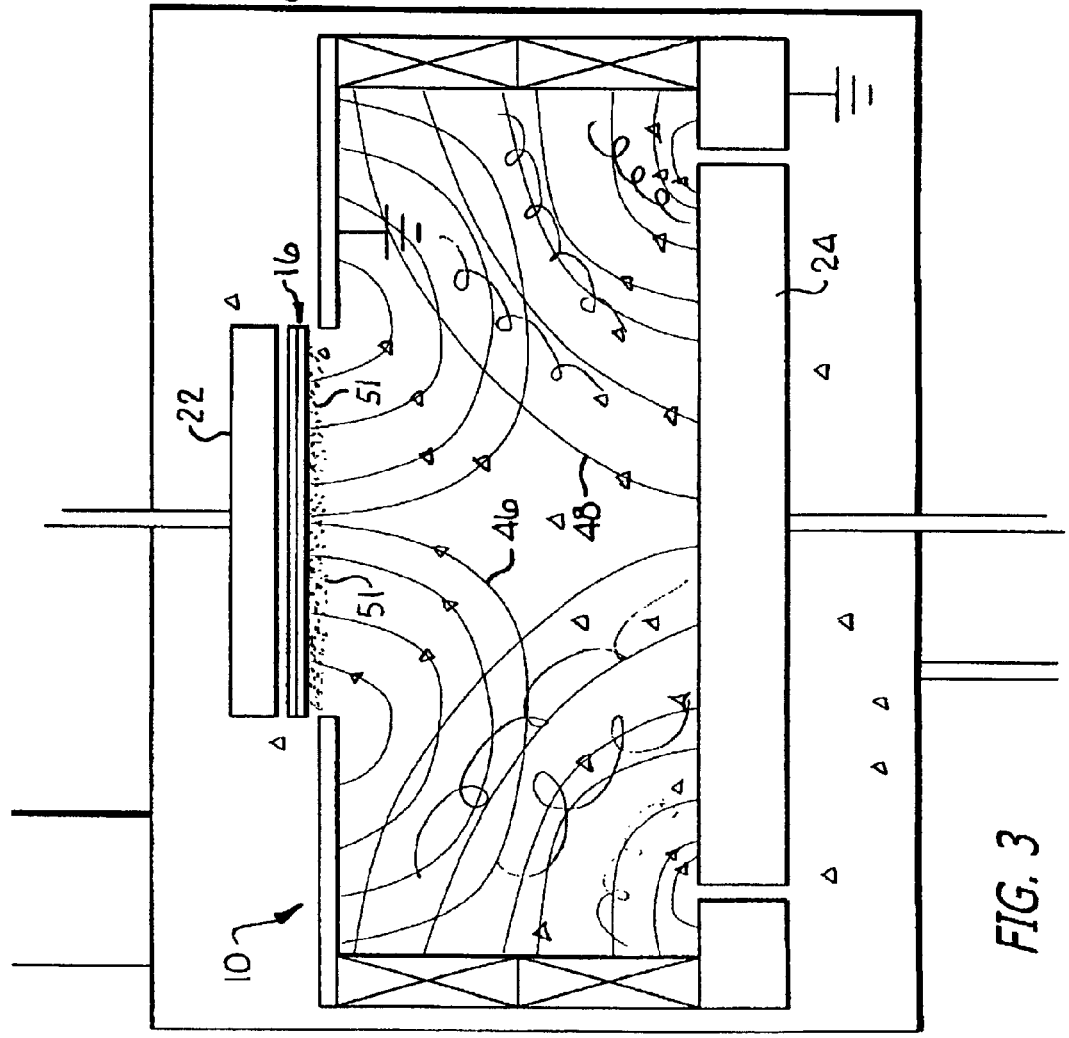
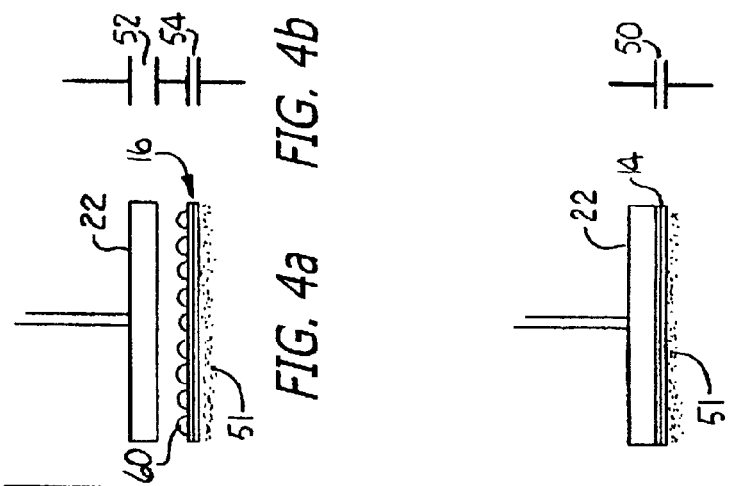
FIG. 3
FIG. 4a   FIG. 4b
FIG. 5a   FIG. 5b
PRIOR ART   PRIOR ART

SYSTEM FOR, AND METHOD OF, ETCHING A SURFACE ON A WAFER

This invention relates to apparatus for, and methods of, etching a surface of a wafer to provide a fresh and clean surface for providing a deposition on the surface. More particularly, the invention relates to apparatus for, and methods of, etching a surface of an insulating layer in a wafer, and etching walls defining a socket in the wafer, so that the etchings of the surface of the insulating layer, and the etching of the surfaces of the walls in the socket, are smooth and uniform and so that the surfaces do not have any pits.

BACKGROUND OF THE INVENTION

Integrated circuit chips are being used now in all kinds of apparatus to provide complex electrical circuitry for controlling different operations or for providing data and mathematical calculations in business, education, science and many other fields. With successive advances in time, the size of the integrated circuit chips has progressively decreased, particularly because the thickness of the electrical leads in the chips has progressively decreased. Even as the chips have decreased in size, the circuitry on the chips has become progressively complex.

The integrated chips are formed in wafers, each of which holds a number, hundreds and often even thousands, of integrated circuit chips. The chips on the wafer are formed from a plurality of successive layers. Some of the layers provide electrical insulation. Others of the layers are electrically conductive. Electrical pegs or vias are provided between the different electrically conductive layers. The electrical pegs or vias are disposed in sockets provided in insulating layers in the chips. When the fabrication of the wafers has been completed, each chip defines electrical circuitry which performs specialized, often complex, operations.

The fabrication of the different layers in an integrated circuit chip has to be precise. For example, the width and thickness of the circuit leads in the different layers have to be precise in order to maintain the proper impedance values for different components in the circuits. If the proper impedance values are not maintained, the operation of the circuitry in the integrated circuit chip is impaired. Variations in the width and thickness of the circuit leads can result from impurities in the surfaces of different layers in the chips and from uneven and non-smooth surfaces on the insulating layers on which electrically conductive material is deposited. The criticality in maintaining surfaces even and smooth has increased as the thickness of the leads on the integrated circuit chips has decreased.

Apparatus has existed for a considerable number of years to etch the surfaces of different layers on the chips. The purpose of the etching has been to clean and refresh the surfaces to receive subsequent layers of deposition. The etching has produced uneven surfaces on the layers, thereby producing variations in the characteristics of the electrical material subsequently deposited on the uneven surfaces. The problem has been aggravated as the thickness of the layers has decreased. Attempts have been made to resolve this problem by making the etched surfaces even and uniform. The attempts have provided significant success but improvements in the smoothness and evenness of the surfaces of the insulating layer are constantly desired.

BRIEF DESCRIPTION OF A PREFERRED EMBODIMENT OF THE INVENTION

First and second electrodes at opposite ends and magnets between the electrodes define an enclosure. Inert gas (e.g. argon) molecules pass into the enclosure through an opening near the first electrode and from the enclosure through an opening near the second electrode. A ring near the first electrode, a plate near the second electrode and the magnets are at a reference potential (e.g. ground).

The first electrode is biased at a high negative voltage by a high alternating voltage to produce a high intensity electrical field. The second electrode is biased at a low negative voltage by a low alternating voltage to produce a low intensity electrical field. Electrons movable in a helical path in the enclosure near the first electrode ionize inert gas molecules.

A wafer having a floating potential and having an insulating layer is closely spaced from the second electrode. The electrode and the wafer define plates of a first capacitor having a dielectric formed by inert gas molecules and ions between the plates to provide a high impedance. The wafer and the gas ions in the enclosure define opposite plates of a second capacitor, in series with the first capacitor, having the insulating layer as the dielectric to define a low impedance.

The first capacitor accordingly controls and limits the speed at which the gas ions move to the insulating layer surface to etch this surface. The resultant etch, only of a relatively few Ångstroms, of the insulating layer is smooth, uniform and accurate even in holes as for vias and does not have any pits.

BRIEF DESCRIPTION OF THE DRAWINGS

In the drawings:

FIG. 3 is an enlarged schematic elevational view of electrical fields produced in an enclosure by the apparatus shown in FIG. 1, the wafer being disposed in the enclosure;

FIG. 4a is an enlarged fragmentary elevational schematic view showing the disposition of particular ones of the components in the preferred embodiment of FIG. 1;

FIG. 4b is an enlarged fragmentary schematic circuit diagram showing the electrical equivalent of the components in FIG. 4a as a pair of capacitors in series, one of the capacitors having a high impedance and the other capacitor having a low impedance;

FIG. 5a is an enlarged fragmentary schematic elevational view showing the disposition in the prior art of the particular ones of the components shown in FIG. 4a; and FIG. 5b is an enlarged fragmentary schematic circuit diagram showing the electrical equivalent of the disposition of the prior art components in FIG. 5a as a single capacitor having a low impedance.

DETAILED DESCRIPTION OF A PREFERRED EMBODIMENT OF THE INVENTION

Figure 1:
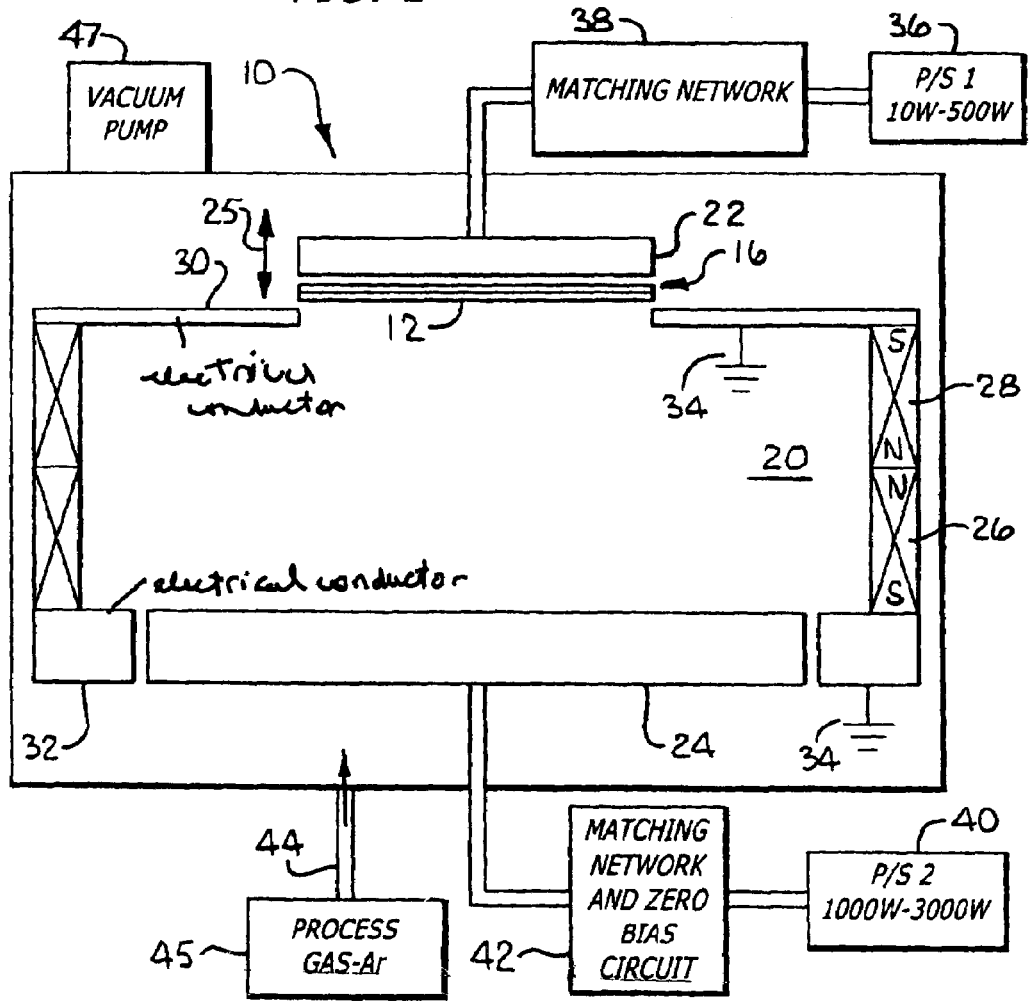
FIG. 1 is a schematic elevational view of apparatus constituting a preferred embodiment of the invention for etching a surface of an insulating layer in a wafer to produce an even and uniform surface, without any pits on the insulating layer.

FIGS. 1-4 show a preferred embodiment, generally indicated at 10, of apparatus for etching a surface 12 of an insulating layer 14 in a wafer generally indicated at 16. As will be appreciated, the wafer may be formed from a plurality of stacked layers, some of them electrically conductive and others electrically insulating. In addition to the insulating layer 14, an electrically conductive layer 15 and an electrically insulating base layer 17 are schematically shown to represent the different layers in the integrated circuit chip. The insulating layer 14 may have a plurality of a grooves or sockets 18. The insulating layer 14 may illustratively be made from a suitable material such as a polyamide.

Figure 2:
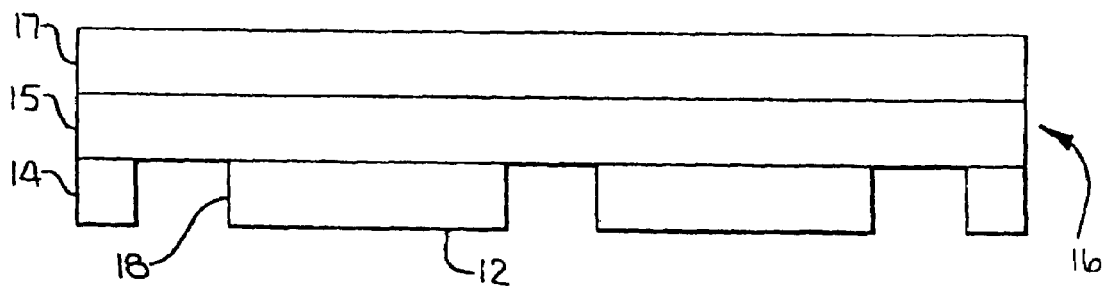
FIG. 2 is an enlarged fragmentary simplified schematic elevational view of the construction of a wafer.

The insulating layer 14 may illustratively have a thickness of approximately three (3) microns. The sockets 18 may be completely, or partially, formed through the thickness of approximately three (3) microns in the insulating layer 14. FIG. 2 illustratively shows the sockets 18 as extending completely through the thickness of the insulating layer 14. The preferred apparatus 10 of this invention illustratively may etch approximately one hundred angstroms (100 Å) from the surface 12 of the insulating layer 14 in a smooth and even layer and without any pits in the layer.

The apparatus 10 includes an enclosure 20 which may be formed in part by an electrode 22, and electrode 24 displaced from, but preferably substantially parallel to, the electrode 22 and magnets 26 and 28 disposed in a transverse (preferably substantially perpendicular) relationship to the electrodes 22 and 24. The electrode 22 is disposed in a contiguous but spaced and substantially parallel relationship to the wafer 16 and is movable in position toward or away from the wafer, as indicated by a double-headed arrow 25. The spacing between the wafer 16 and the electrode 22 may illustratively be in the order of 0.1-2 mm. A plate 30 extending from the magnet 28 in a substantially parallel and adjacent, but spaced, relationship to the electrode 22 also defines the enclosure 20. A ring 32 extending from the magnet 26 to a position spaced from, but adjacent to, the electrode 24 also defines in part the enclosure 20. The plate 30 and the ring 32 may be considered as electrical conductors.

The magnets 26 and 28 preferably constitute permanent magnets but they may also constitute magnetizable members on which windings are disposed to produce a saturable magnetic flux when a current flows through the windings. The magnets 26 and 28 may have a north polarization (indicated by the letter "N" in FIG. 1) at their positions of contiguity and may have a south polarization (indicated by the letter "S" in FIG. 1) at their opposite ends. The magnets 26 and 28, the plate 30 and the ring 32 are provided with a reference potential such as a ground 34. The wafer 16 is disposed in close proximity to the electrode 22 within the enclosure 20 and in substantially parallel relationship to the electrode. The wafer 16 is at a floating potential.

The electrode 22 receives a relatively low AC voltage from a power supply 36 at a suitable frequency such as approximately 13.56 MHz. As will be explained in detail subsequently, this causes the electrode 22 to receive a relatively low negative DC bias such as a negative bias in the order of –100 volts to –500 volts. A matching network 38 is preferably disposed electrically between the power supply 36 and the electrode 22 to match the impedance of the power supply to the impedance of the electrode.

The electrode 24 receives a relatively high AC voltage from a power supply 40 at a suitable frequency such as approximately 13.56 MHz. As will be explained in detail subsequently, this causes the electrode 24 to have a relatively high negative DC bias such as a negative bias in the order of –1000 volts to –3000 volts. A matching network and zero bias circuit 42 are preferably disposed electrically between the power supply 40 and the electrode 24 to match the impedance of the power supply to the impedance of the electrode and to provide substantially a ground potential on the electrode. The zero bias circuit may constitute an inductance between the electrode 24 and ground to provide a high impedance for alternating voltages and to provide a low impedance for a DC voltage. The power supplies 36 and 40 may constitute a single power supply.

A conduit 44 is provided for introducing molecules of an inert gas such as argon into the enclosure 20 from a source 45. The argon molecules pass into the enclosure 20 through the space between the electrode 24 and the ring 32. The argon molecules pass out of the enclosure 20 through the space between the plate 30 and the wafer 16. The argon gas flow through the enclosure 20 may illustratively be at a flow rate of 0.1-50 SCCM at a working pressure of 0.5-5 mTorr. The movement of the argon molecules through the enclosure 20 is facilitated by a vacuum pump 47.

A negative bias is produced on the electrode 22 because of the alternating voltage applied to the electrode. In the positive half cycles of the alternating voltage, the electrode 22 attracts electrons because of the electrical field between the electrode and the ground potential 34 on the plate 30. In the negative half cycles of the alternating voltage, positive ions are attracted to the electrode because of the electrical field between the electrode and the ground potential 34 on the plate 30. Since the electrons are considerably lighter in weight than the positive ions, they move faster toward the electrode 22 than the positive ions. This causes the electrons to accumulate in the space adjacent the electrode 22, thereby producing the negative DC bias on the electrode. The electrode 24 receives a negative bias because of the same physical phenomenon. However, the negative bias on the electrode 22 is considerably less than the negative DC bias on the electrode 24 because of the differences in the voltages applied to the electrodes.

As previously indicated, the magnetic field produced by the magnets 26 and 28 is substantially perpendicular to the electrical fields produced by the electrodes 22 and 24. This causes electrons in the enclosure 20 to move in a spiral or helical path between the electrode 22 and the plate 30, and between the electrode 24 and the ring 32, because of the ground potentials on the plate and the ring. The electrons strike molecules of argon gas and ionize these molecules. Since the electrical field between the electrode 24 and the ring 32 is considerably stronger than the electrical field between the electrode 22 and the plate 30, most of the ionization of argon molecules occurs in the region of the electrode 24. Some of these argon ions then move into the region of the electrode 22.

FIG. 3 illustrates at 46 lines of force produced by the electrical field between the electrode 22 and the plate 30. Arrows indicate the direction of the lines 46 of force. The electrons in the enclosure 20 travel in a spiral or helical path along the force lines 46, the spiral or helical path resulting from the force of the magnetic field as the electrons move along the force lines 46. In like manner, FIG. 3 illustrates at 48 lines of force produced by the electrical field between the electrode 24 and the ring 32 and between the electrode and the grounded magnets 26 and 28. The electrons in the enclosure 20 travel in a spiral or helical path along the force lines 48 because of the force on the electrons by the magnets 26 and 28.

Applicant's assignee of record in this application has previously sold one (1) unit of apparatus with features similar to the apparatus shown in FIG. 1. This unit may have been sold more than one (1) year prior to the date of this application. However, there is one significant difference between the apparatus 10 constituting the preferred embodiment of the invention and the unit previously sold by applicant's assignee. The significant difference is that the wafer 16 engaged the electrode 22 in the one (1) unit sold prior to the date of this application. The circuit equivalent of this arrangement is shown in FIG. 5b and is indicated as prior art in that Figure. As previously indicated, the wafer 16 is separated from the electrode 22 in the preferred embodiment 10 of this invention.

As will be seen, the combination of the electrode 22 and the wafer 16 in FIG. 5a is seen as a single electrode or plate in a capacitor 50 in FIG. 5b. The other electrode or plate in the capacitor 50 is defined by the positive ions in the enclosure 20 at positions adjacent the electrode 24. These positive ions are schematically illustrated by dots (.) at 51 in FIG. 3. The dielectric between the plates of the capacitor 50 may be considered to be the insulating layer 14. The impedance of the capacitor 50 is accordingly relatively low because the insulating layer 14 is relatively thin and because the dielectric constant of the insulating layer is lower than the dielectric constant of air or the dielectric constant of a vacuum.

Since the impedance of the capacitor 50 is relatively low, a relatively large current flows through the capacitor. This current results from the attraction of the argon ions to the insulating layer 14 because of the negative DC voltage on the electrode 22. The relatively large current produces an etching of molecules and ions from the surface 12 of the insulating layer 14. This etching is of such a force that the etching is not smooth, even or uniform. Pitting of the surface of the insulating layer 14 accordingly occurs. The problem is particularly aggravated in considering the etching of the walls of the sockets 18 in the insulating layer 14.

Since the etching does not result in a smooth, even and uniform surface 12 of the insulating layer 14, any subsequent deposition of an electrically conductive layer on the surface 12 has significant differences in thickness of the electrically conductive material at different positions on the surface 12. This significantly affects the electrical characteristics of the electrical deposition on the insulating layer 14 and produces significant deterioration in the performance characteristics of the integrated circuit chips formed from the wafer.

As previously indicated, the wafer 16 is separated from the electrode 22 in the preferred embodiment 10 of this invention. The separation may be in the order of 0.1 to 2.0 millimeters, This causes two (2) capacitors 52 and 54 in FIG. 4b to be defined by the electrode 22, the wafer 16 and the charge produced by the argon ions 51 in the enclosure 20 in the vicinity of the electrode 22. The plates of the capacitor 52 in FIG. 4b may be respectively considered to be defined by the electrode 22 and by the electrically conductive deposition layers in the wafer 16. Although there may be argon ions in this gap, the argon ions are relatively small in number. Furthermore, the gap is so small that the argon ions cannot be accelerated to any significant degree. Because of these factors, the dielectric in the capacitor 52 in FIG. 4b may be considered to be the gap between the electrode 22 and the wafer 16. This gap causes the impedance of the capacitor 52 to be relatively high. This impedance can be adjusted to any desired value by adjusting the position of the electrode 22 in the opposite directions 25 to vary the distance between the electrode and the wafer 16.

The capacitors 52 and 54 may be considered to be in series as shown in FIG. 4b. The capacitor 54 may be considered to have plates defined by the electrically conductive layers in the wafer 16 and by the charge provided by the argon ions 51 in the enclosure 20 in the vicinity of the electrode 20. The dielectric for the capacitor 54 may be considered to be the insulating layer 14. The impedance of the capacitor 54 is relatively low, particularly in relation to the impedance of the capacitor 52, because of the thin dimension of the insulating layer 14 and the dielectric constant of the insulating layer.

The current through the series circuit including the capacitors 52 and 54 in FIG. 4b is limited and controlled by the capacitor 52 because of the high impedance of the capacitor. This limited and controlled current provides a gentle etching of the surface 12 of the insulating layer 14 and of the walls of the sockets 18. As a result, any specified amount of material may be etched from the surface 12 of the insulating layer 14 and from the walls of the sockets 18. For example, an etching of the material of the insulating layers 14 and the walls of the sockets 18 may be provided in a thickness of approximately one hundred Ångstroms (100 Å).

The etching produces smooth, even and uniform surfaces of the insulating layer 14 by the apparatus 10 as a result of the etching. This provides for a deposition of a smooth, uniform and even thickness of an electrically conductive material on the etched surface of the insulating layer 14. The etching of the walls in the sockets 18 is also even, uniform and smooth. This constitutes a distinct advance over the prior art, even the prior art as represented by the single unit of the apparatus sold by applicant's assignee prior to the filing date of this application, this prior unit being shown in FIG. 5a and being represented by the electrical circuitry shown in FIG. 5b.

As shown schematically in FIG. 4a, balls 60 made from a suitable material such as copper may be provided on the electrically conductive surface of the wafer 160. The balls 60 operate as electrical leads. The balls 60 are known in wafers of the prior art. The balls 60 are not affected by the actions of the capacitances 52 and 54 in FIG. 4b.

Although the invention has been disclosed and illustrated with relation to particular embodiments, the principles involved are capable of being used in numerous other embodiments which will be apparent to persons of ordinary skill in the art. The invention is, therefore, to be limited only as indicated by the scope of the appended claims.

What is claimed is:

1. In combination for etching an insulating layer in a wafer to present a clean and fresh surface on the insulating layer for deposition,
   a conduit for molecules of an inert gas,
   a first electrode biased to a first voltage and spaced from the wafer,
   a second electrode biased to a second voltage lower than the first voltage and spaced from the first electrode and the wafer and spaced from the wafer less than the first electrode,
   magnetic members providing a magnetic field,
   the first electrode and the magnetic members being disposed relative to each other and to the molecules of the inert gas for ionizing the molecules of the inert gas, and
   the second electrode and the wafer being disposed relative to each other and to the ions of the inert gas, and the second electrode being constructed, to obtain a movement of the ions to the wafer at a low and controlled speed for an etching of the surface of the insulating layer by the ions at the low and controlled speed.

2. In a combination as set forth in claim 1,
   a first member disposed adjacent the first electrode for providing a reference potential different from the bias on the first electrode to create a first electrical field, and
   a second member disposed adjacent the second electrode for providing the reference potential to create a second electrical field,
   the first electrical field and the magnetic field being disposed relative to each other and to the molecules of the inert gas from the supply for ionizing the molecules of the inert gas, the second electrical field and the magnetic field being disposed relative to each other and to the ions of the inert gas to obtain the movement of the ions to the wafer at the low and controlled speed, the second electrode being contiguous to, but spaced from, the wafer.

3. In a combination as set forth in claim 1, a first source of alternating voltage for creating the bias on the first electrode, the bias on the first electrode being a negative direct voltage, a second source of alternating voltage for creating the bias on the second electrode, the bias on the second electrode being a negative direct voltage, the bias on the first electrode being greater than the bias on the second electrode.

4. In a combination as set forth in claim 1, the first electrode being disposed in a substantially parallel and contiguous relationship to the wafer, there being a path for the flow of the argon molecules from the vicinity of the first and second electrodes and the magnetic members.

5. In a combination as set forth in claim 1, the wafer being at a floating potential, there being first and second electrically conductive members respectfully adjacent the first and second electrodes at a reference potential to provide for the creation of electrical fields respectively between the first electrode and the first electrically conductive member and between the second electrode and the second electrically conductive member.

6. In a combination as recited in claim 2, a first source of alternating voltage for creating the bias on the first electrode, the bias on the first electrode being a negative direct voltage, a second source of alternating voltage for creating the bias on the second electrode, the bias on the second electrode being a negative direct voltage, the first electrode being disposed in a substantially parallel and contiguous relationship to the wafer, there being a path for the flow of the molecules of the inert gas from the vicinity of the first and second electrodes and the magnetic members, the wafer being at a floating potential, there being first and second electrically conductive members respectfully adjacent, but spaced from, the first and second electrodes at a reference potential to provide for the creation of electrical fields respectively between the first electrode and the first electrically conductive member and between the second electrode and the second electrically conductive member.

7. In combination for etching an insulating layer in a wafer to present a clean and fresh surface on the insulating layer for deposition, an enclosure defined by magnetic members forming a magnetic field and by first and second electrodes spaced from each other and from the wafers and providing electrical fields, a supply of molecules of an inert gas for introducing the molecules into the enclosure, a first source of an alternating voltage for producing a direct negative voltage of a high magnitude on the first electrode for the creation of a first electrical field of a high magnitude in the enclosure, a second source of an alternating voltage for producing a direct negative voltage of a low magnitude on the second electrode for the creation of a second electrical field of a low magnitude in the enclosure, the molecules of the inert gas in the enclosure being ionized by the combination of the electrical and magnetic fields, and the wafer being disposed relative to the second electrode and relative to the ions of the inert gas in the enclosure to receive an etching of a low magnitude on the surface of the insulating layer by the ions of the inert gas in the enclosure.

8. In a combination as set forth in claim 7, an opening in the enclosure for the flow of the molecules and ions of the inert gas from the enclosure, the first source of the alternating voltage being operative to produce a direct voltage of the high magnitude and a negative polarity at the first electrode, the second source of the alternating voltage being operative to produce a direct voltage of the low magnitude and a negative polarity at the second electrode, the second electrode being disposed in contiguous, but spaced, relationship to the wafer.

9. In a combination as set forth in claim 7, a first electrical conductor disposed in adjacent but spaced relationship to the first electrode at a particular reference potential to produce a first electrical field between the first electrode and the first electrical conductor, and a second electrical conductor disposed in adjacent but spaced relationship to the second electrode at the particular reference potential to produce a second electrical field between the second electrode and the second electrical conductor.

10. In a combination as set forth in claim 7, the wafer being disposed between the first and second electrodes in a substantially parallel relationship to the first and second electrodes and closer to the second electrode than the first electrode, the wafer being at a floating potential relative to the negative potentials on the first and second electrodes and relative to the reference potential.

11. In a combination as set forth in claim 7, the wafer being disposed in a spaced, but adjacent, relationship to the second electrode to create a first capacitor between the second electrode and the wafer and to create a second capacitor between the wafer and the ions of the inert gas in the enclosure.

12. In a combination as set forth in claim 10, a vacuum pump for producing a vacuum in the enclosure, there being a space between the second electrode and the second conductive member for the flow of the molecules and ions of the inert gas from the enclosure.

13. In a combination as set forth in claim 10, a first electrical conductor disposed in an adjacent, but spaced, relationship to the first electrode at a particular reference potential to produce a first electrical field between the first electrode and the first electrical conductor, a second electrical conductor disposed in an adjacent, but spaced, relationship to the second electrode at the particular reference potential to produce a second electrical field between the second electrode and the second conductor, the wafer being disposed in a spaced, but contiguous, relationship to the second electrode to create a first capacitor between the second electrode and the wafer and to create a second capacitor between the wafer and the ions of the inert gas in the enclosure.

14. In combination for etching an insulating layer in a wafer disposed in an enclosure to present a clean and fresh surface on the insulating layer for deposition, magnetic members defining a magnetic field in the enclosure, a first source of an alternating voltage for providing a first electrical field of a high magnitude in the enclosure, a first electrode included in the enclosure and connected to the first source of voltage for providing a negative DC voltage of a relatively high magnitude at a first position in the enclosure, a second source of an alternating voltage for providing a second electrical field of a low magnitude in the enclosure, a second electrode included in the enclosure and connected to the second source of the alternating voltage for providing a negative DC voltage of a relatively low magnitude at a second position displaced from the first position and the wafer but near the wafer, a conduit for introducing molecules of an inert gas into the enclosure for ionization by the combination of the electrical and magnetic fields to produce ions of high density, the second electrode and the wafer providing a first capacitor of a high impedance, and the wafer and the ions in the enclosure providing a second capacitor of a low impedance, in a circuit to produce a current of a low magnitude for etching the surface of the insulating layer in the wafer.

15. In a combination as set forth in claim 14, the first capacitor including a dielectric of the molecules and ions of the inert gas and the second capacitor including a dielectric constituting the insulating layer.

16. In a combination as set forth in claim 14, a first electrically conductive member disposed in an adjacent but spaced relationship to the first electrode and having a reference potential to provide an electrical field between the first electrode and the first electrically conductive member, and a second electrically conductive member disposed in an adjacent but spaced relationship to the second electrode and having the reference potential to provide an electrical field between the second electrode and the second electrically conductive member.

17. In a combination as set forth in claim 14, the wafer having a floating potential and being disposed between the first and second electrodes in closer proximity to the second electrode than to the first electrode and being substantially parallel to the first and second electrodes.

18. In a combination as set forth in claim 17, the conduit being disposed adjacent the first electrode to introduce the molecules of the inert gas into the enclosure and the molecules and ions of the inert gas being passed from the enclosure at a position adjacent to the second electrode.

19. In a combination as set forth in claim 14, the magnetic members being disposed in a direction substantially perpendicular to the first and second electrodes to produce a helical movement of electrons in the enclosure and to provide for the production of the ions from the molecules of the inert gas by the electrons in the helical movement.

20. In a combination as set forth in claim 14, a first electrically conductive member disposed in adjacent but spaced relationship to the first electrode and having a reference potential to provide an electrical field between the first electrode and the first electrically conductive member, a second electrically conductive member disposed in adjacent but spaced relationship to the second electrode and having the reference potential to provide an electrical field between the second electrode and the second electrically conductive member, the wafer having a floating potential and being disposed between the first and second electrodes in closer proximity to the second electrode than to the first electrode and being substantially parallel to the first and second electrodes, the conduit being disposed adjacent, but spaced from, the first electrode to introduce the molecules of the inert gas into the enclosure and the molecules and ions of the inert gas being passed from the enclosure at a position adjacent to, but spaced from, the second electrode, the magnetic members being disposed in a direction substantially perpendicular to the first and second electrodes to produce a helical movement of electrons in the enclosure and to provide for the production of the ions from the molecules of the inert gas by the electrons in the helical movement.

21. In combination for etching an insulating layer in a wafer to present clean and fresh surfaces on the insulating layer for deposition, an enclosure first and second electrodes disposed in the enclosure and displaced from each other and from the wafer for producing electrical fields in the enclosure, and magnetic members disposed in the enclosure for producing a magnetic field in the enclosure in a direction transverse to the electrical field, a first voltage source for producing a voltage of a high magnitude in the vicinity of the first electrode to obtain a production of a high electrical field in the enclosure, a second voltage source for producing a voltage of a low magnitude in the vicinity of the second electrode to obtain a production of a low electrical field in the enclosure, and a supply of molecules of an inert gas for introduction into the enclosure to cooperate with the first and second electrodes and the magnetic members in obtaining an ionization of the gas molecules in the enclosure by the electrical and magnetic fields in the enclosure and in obtaining a movement of the ions in the enclosure to the insulating layer in the wafer at a speed to obtain a smooth and uniform etching of the surface of the insulating layer at a low rate without any pits in the surface of the insulating layer.

22. In a combination as set forth in claim 21 wherein, the first electrode provides the high electrical field in cooperation with the magnetic field for producing an ionization of molecules of an inert gas in the enclosure and wherein the second electrode provides the low electrical field in cooperation with the magnetic field for etching the surface of the insulating layer on the wafer to obtain the smooth and uniform etching on the surface of the insulating layer at the low rate without any pits in the surface of the insulating layer.

23. In a combination as set forth in claim 21 wherein the first voltage source applies an alternating voltage from the voltage source to the first electrode to produce a strong negative direct voltage in the vicinity of the first electrode and wherein the second voltage source applies an alternating voltage from the second voltage source to the second electrode to produce a weak negative direct voltage in the vicinity of the second electrode.

24. In a combination as set forth in claim 21 wherein a first electrical conducting member is disposed in a cooperative relationship with the first electrode to provide for the production of the high electrical field and wherein a second electrical conducting member is disposed in a cooperative relationship with the second electrode to provide for the production of the low electrical field.

25. In a combination as set forth in claim 24 wherein the first and second electrodes are substantially parallel to the wafer and wherein the first and second electrical conducting members are substantially parallel to the first and second electrodes.

26. In a combination as set forth in claim 25 wherein the first and second electrical conducting members are respectively disposed in a substantially parallel, but spaced, relationship to the first and second electrodes.

27. In a combination as set forth in claim 22 wherein the wafer and the second electrode define a series relationship between two (2) capacitors, one having a high capacity impedance and the other having a low capacity impedance and wherein the high capacity impedance limits the energy providing for the etching of the surface of the insulating layer in the wafer.

28. In a combination as set forth in claim 26 wherein, the wafer and the second electrode define a series relationship between two (2) capacitors, one having a high capacity impedance and the other having a low capacity impedance and wherein the high capacity impedance limits the energy providing for the etching of the surface of the insulating layer in the wafer.

29. In a combination a set forth in claim 23 wherein a first electrical conducting member is disposed in cooperative relationship with the first electrode to provide for the production of the high electrical field and wherein a second electrical conducting member is disposed in cooperative relationship with the second electrode to provide for the production of the low electrical field.

30. In a combination as set forth in claim 28 wherein the first voltage source applies an alternating voltage from the first voltage source to the first electrode to produce a strong negative direct voltage in the vicinity of the first electrode and wherein the second voltage source applies an alternating voltage from the source to the second electrode to produce a weak negative direct voltage in the vicinity of the second electrode wherein a first electrical conducting member is disposed in cooperative relationship with the first electrode to provide for the production of the high electrical field and wherein a second electrical conducting member is disposed in cooperative relationship with the second electrode to provide for the production of the low electrical field.

* * * * *